(12) United States Patent
Brown

(10) Patent No.: US 6,534,999 B2
(45) Date of Patent: Mar. 18, 2003

(54) CABLE SENSOR

(75) Inventor: Richard Hunter Brown, Dreieich-Offenthal (DE)

(73) Assignee: Measurement Specialties, Inc.

( * ) Notice: Subject to any disclaimer, the term of this patent is extended or adjusted under 35 U.S.C. 154(b) by 0 days.

(21) Appl. No.: 09/991,190

(22) Filed: Nov. 15, 2001

(65) Prior Publication Data

US 2002/0079905 A1 Jun. 27, 2002

Related U.S. Application Data

(60) Provisional application No. 60/249,130, filed on Nov. 16, 2000.

(51) Int. Cl.[7] ............ H04B 3/46; G01R 31/08; G01L 1/18; H01B 7/00
(52) U.S. Cl. ............ 324/543; 324/525; 73/862.68; 174/102 SC
(58) Field of Search ............ 324/543, 544, 324/539, 525; 73/514.34, 721, 727, 862.68; 340/545.4; 174/28, 102 R, 105 R, 106 R, 102 SC

(56) References Cited

U.S. PATENT DOCUMENTS

| | | | |
|---|---|---|---|
| 3,671,662 A | * | 6/1972 | Miller et al. ............ 174/28 |
| 4,183,010 A | * | 1/1980 | Miller ............ 174/101.5 |
| 4,487,057 A | * | 12/1984 | Lutz ............ 174/11 R |
| 5,101,161 A | * | 3/1992 | Walsh et al. ............ 324/149 |
| 5,164,709 A | * | 11/1992 | Lamberty et al. ............ 180/273 |
| 5,404,128 A | | 4/1995 | Ogino et al. ............ 340/425.5 |
| 5,747,993 A | | 5/1998 | Jacobsen et al. ............ 324/109 |
| 5,821,743 A | | 10/1998 | Page, Jr. et al. ............ 324/207.1 |
| 6,180,877 B1 | * | 1/2001 | Lamesch et al. ............ 174/28 |

FOREIGN PATENT DOCUMENTS

| | | | | |
|---|---|---|---|---|
| EP | 0 995 639 A2 | 10/1999 | ............ | B60R/21/01 |
| GB | 2317707 | 9/1997 | ............ | G01R/31/02 |

* cited by examiner

*Primary Examiner*—Christine Oda
*Assistant Examiner*—Anjan K. Deb
(74) *Attorney, Agent, or Firm*—Duane Morris LLP

(57) ABSTRACT

A sensor cable (10) for detecting and/or locating a deformation of the cable includes a conductive core (20), a dielectric layer (40), a controlled resistive layer (50), a piezoresistive layer (60), and an outer shield (70). Deformation of the cable (10) creates a change in resistance between the shield (70) and the controlled resistive layer (50), and also creates a piezoelectric-induced voltage between the conductive core (20) and the controlled resistive layer (50). The incidence and/or location of a deformation of the cable is deducible from electrical parameters, indicative of the change in resistance and the induced voltage, measured at one or both ends of the sensor cable.

18 Claims, 5 Drawing Sheets

CABLE SENSOR

CROSS REFERENCE TO RELATED APPLICATIONS

This application claims priority from U.S. provisional application No. 60/249,130, filed on Nov. 16, 2000.

FIELD OF THE INVENTION

The present invention relates to sensor systems in general, and more particularly, to piezoelectric and piezoeresistive sensor cables for anomaly and/or deformation detection and localization.

BACKGROUND

Sensor detection systems currently enjoy a variety of applications. For example in the automotive industry, sensor devices that trigger safety functions such as airbags need to be particularly reliable and fail-safe. In U.S. Pat. No. 5,404,128 a presence-detecting sensor positioned in a seat of a vehicle to detect the presence of a human being is disclosed. The sensor is interconnected to control means that control functioning of the vehicle. The sensor is a piezoelectric element for detecting vibrations and is provided with a self-diagnostic function. One of these self-diagnosis means is to position a termination resistance between electrodes, and pass an electric current through the sensor. If the sensor is severed, this can be detected as the circuit is open so that no current flows. If a short circuit occurs along the sensor, this is also detected by the zero voltage drop thereacross.

Still further, published GB patent application GB 2317707 entitled "CABLE TESTING ARRANGEMENT" describes a cable fault detection system comprising an oscillator connected to an electrode of a cable such that the cable forms an impedance (inductance or capacitance) element of an oscillating circuit. The fault detection system operates within a bandwidth outside that of the sensor operation. By filtering signals the sensor and fault detection activities may operate simultaneously without interfering with one another.

These systems, however, are limited to anomaly detection. Thus, a need exists for an anomaly detection and location sensor system.

SUMMARY OF THE INVENTION

A sensor cable having a first end and a second end includes an outer shield, a piezoresistive portion positioned within the outer shield, a controlled resistive portion positioned within the piezoresistive portion, a dielectric portion positioned within the controlled resistive portion, and a conductive core positioned within the dielectric portion. More particularly, the sensor cables includes a conductive core positioned within the cable, a dielectric layer concentrically positioned radially outward and adjacent the conductive core, a controlled resistive layer concentrically positioned radially outward and adjacent the dielectric layer, a piezoresistive layer concentrically positioned radially outward and adjacent the resistive layer, and an outer shield concentrically positioned radially outward and adjacent the piezoresistive layer.

Deformation of the cable creates a change in resistance between the shield and the controlled resistive layer. Electrical parameters between the controlled resistive layer and the shield are detectable at each end of the cable. The location of the deformation is deducible by comparing detected electrical parameters indicative of the change in resistance at each corresponding end of the cable.

BRIEF DESCRIPTION OF THE DRAWINGS

The above and other advantages and features of the present invention will be better understood from the following detailed description of the preferred embodiments of the invention, which is provided in connection with the accompanying drawings. The various features of the drawings may not be to scale. Included in the drawing are the following figures.

DETAILED DESCRIPTION

In general, a cable sensor as described herein provides a means for detecting and locating an anomaly or event, and a means for checking for the presence or absence of various fault conditions, either continuously or upon interrogation. These means are provided through the use of a piezoresistive cable portion having a first end, and a second end opposite the first end, wherein the incidence and location of an impact or deformation of the cable is detected and localized by comparing the resistance of the cable as measured between two points at each end of the cable. In another embodiment of a cable sensor, piezoresistive and piezoelectric cable portions are utilized to provide means for detecting the incidence and determining the location of an impact, or a deformation of the cable.

Figure 1:
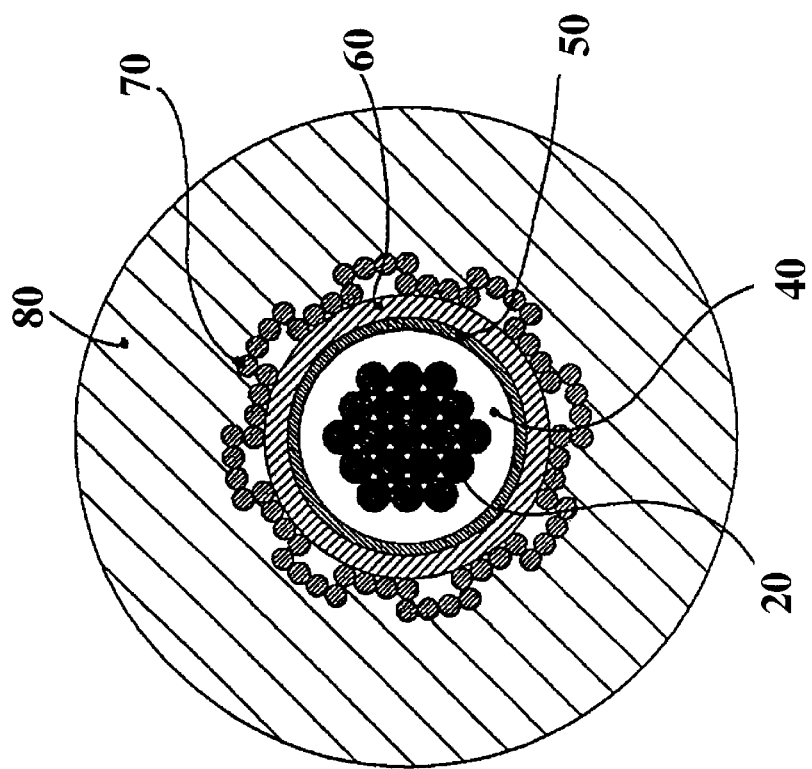
FIG. 1 is a cross sectional view of an illustration of a piezo sensor cable structure in accordance with the present invention.

Referring to FIG. 1, there is shown a cable sensor 10, having a length L (length dimension not shown in FIG. 1) comprising an electrically conductive core 20, a dielectric layer 40, a controlled resistive coating or layer 50, a piezoresistive layer 60, an outer shield 70, and an optional outer jacket 80. The cable sensor 10 is configured with an electrically conductive core 20 at its center, a dielectric layer 40 concentrically positioned radially outward and adjacent the electrically conductive core 20, a controlled resistive coating 50 concentrically positioned radially outward and adjacent the dielectric layer 40, a piezoresistive layer 60 concentrically positioned radially outward and adjacent the resistive coating 50, an outer shield 70 concentrically positioned radially outward and adjacent the piezoresistive layer 60, and an optional outer jacket 80 concentrically positioned radially outward and adjacent the outer shield 70.

The electrically conductive core 20 may comprise a plurality of stranded conductors, as shown in FIG. 1, or may comprise a single solid conductor. The electrically conductive core 20 may comprise any appropriate electrically conductive material, such as a metal, metallic compounds, semiconductors, and semiconductor compounds, for example.

The dielectric layer 40 may comprise any appropriate material comprising piezoelectric properties. That is, providing a mechanical deformation in response to an electric field and providing an electric field in response to a mechanical deformation. The dielectric layer 40 may comprise appropriate materials, such as polyvinyl chloride (PVC), nylon, piezoelectric ceramics, polarized piezoelectric polymers, or a permanently polarized electret material such as Polytetrafluoroethylene (PTFE), for example. Preferably, the dielectric layer 40 comprises a polarized fluoropolymer, such as polyvinylidene flouride (PVDF), its copolymers, or copolymers of vinylidene fluoride (VF2), formed into a film.

The controlled resistive coating 50 may comprise any appropriate material having a controlled resistivity along its length. The controlled resistive coating 50 may be co-extruded with the dielectric layer 40, or applied by liquid injection, for example injecting a conductive polymer into a diehead. The controlled resistive coating 50 may also be applied by vacuum deposition of solid metal or alloy, for example. In yet another fabrication method, the dielectric layer 40 and the controlled resistive coating 50 are configured as a spiral-wrap of piezo film 40 positioned around the core 20, wherein the spiral wrap carries a vacuum metallization coating. The metallization coating may be applied to the piezo film 40 prior to the formation of the spiral wrap. The spiral wrap may comprise an inner winding and an outer winding, being wound in opposite sense. As described in detail herein, the resistivity of resistive coating 50 from end to end may vary from approximately zero ohms to several million ohms (M-ohms) depending upon the intended use.

The piezoresistive layer 60 may comprise any appropriate material demonstrating a change in resistance in response to mechanical deformation. For example, piezoresistive layer 60 may comprise an extruded layer of polymer containing conductive particles, or other material demonstrating a perceptive change in resistance when placed under compression. The piezoresistive layer 60 may comprise appropriate materials, such as polyvinyl chloride (PVC) or a polyurethane compound loaded with particles of carbon.

The piezoresistive layer 60 comprises a high value of resistance (e.g., greater than or equal to approximately 1 Mohm) under conditions of zero applied pressure. This value of resistance drops as pressure is applied (e.g., under load). For example, an exemplary configuration of piezoresistive layer 60 comprising a length of approximately 1 centimeter (cm), an inner diameter of approximately 1 millimeter (mm), and a thickness of approximately 0.25 mm, provides a value of resistance measured from end to end of approximately several Mohms under zero load, and is reduced to a few kiloohms (Kohms) under non-destructive compressive load.

The resistivity of the piezoresistive layer 60 is inversely proportional to the applied pressure. That is, an increase in load will result in a decrease in resistance, and a decrease in load will result in an increase in resistance. As described in detail herein, in order to detect and locate an anamoly, it is advantageous if the slope of the logarithm base ten (log) of the resistivity of piezoresistive layer 60 versus the log of the applied pressure is not equal to −1. For example, a decrease in the resistance by a factor of 10, as a result of an increase in the load by a factor of 10, is indicative of a slope of −1. In this situation, a plot of log(R) plotted against log(F) will show a slope of −1 (where R is resistivity and F is force). In order to derive information regarding the distribution of load, it is advantageous that the curve is "non-linear", in the above sense. As herein described, "non-linear", means that the slope of this log/log curve is any other value except −1 (for example, −0.5, or −1.5). When this slope is not equal to −1, then it can be shown that the effect of applying (for example) 1,000 N force over 1 cm length will give a different change in resistance than that resulting from the application of the same 1,000 N force over 10 cm or 100 cm. If the slope does happen to be −1, then application of 1 kN over 1, 10, or 100 cm would give the same loop change, if the resistance of the controlled resistance coating is low. However, a slope of −1 is easily avoided by appropriate choice of design parameters.

Outer shield 70 covers the exterior of the cable 10. Outer shield 70 comprises a braided wire, a metallic foil, or any other appropriate configuration, wherein the shield 70 is electrically conductive. Optional outer jacket 80 is provided for mechanical protection, stability, and overall electrical insulation.

Figure 2:
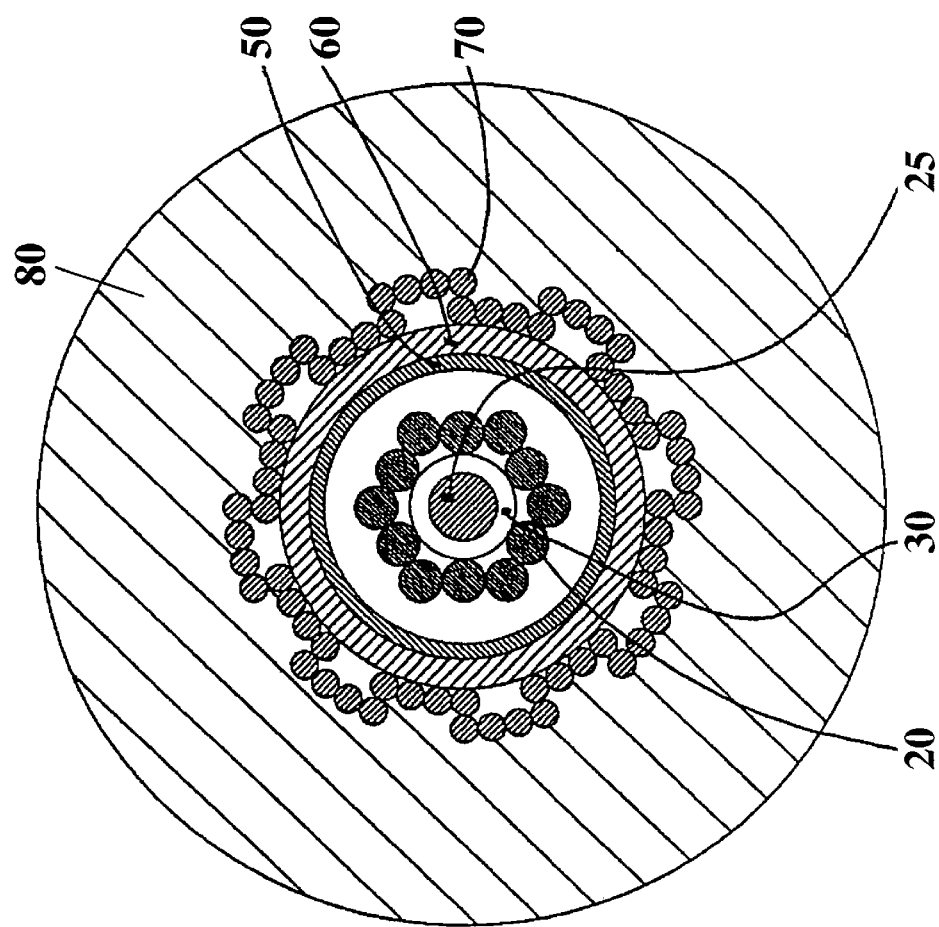
FIG. 2 is a cross sectional view of an illustration of a piezo sensor cable structure comprising a return wire within the core in accordance with the present invention.

FIG. 2 shows another embodiment of a cable sensor 10 comprising insulated center conductor 25. The center conductor 25 provides an electrically conductive return path from the "far end" of cable sensor 10. That is, as described herein in further detail, when detecting and/or localizing an anomaly, electrical parameters, such as voltage, resistance, and current, for example, may be sensed from both ends of the cable sensor 10, or a single end of cable sensor, utilizing center conductor 25. To sense electrical parameters from a single end of the sensor cable, for detecting and/or locating a deformation of the sensor cable, the controlled resistive layer 50 is electrically coupled to the center conductor 25 at a first end of the sensor cable, and the electrical parameters are sensed at a second end of the sensor cable. At the second end of the sensor cable, sensing electrical parameters at the center conductor 25 is equivalent to sensing electrical parameters at the controlled resistive layer 50 at the first end of the sensor cable. The center conductor 25 is positioned at the central core of cable sensor 10. The center conductor 25 is electrically insulated by insulator 30, which is concentrically positioned between the center conductor 25 and the wire core 20. The center conductor 25 is electrically conductive, and may comprise a plurality of stranded conductors or a single solid conductor. The electrically conductive center conductor 25 may comprise any appropriate electrically conductive material, such as a metal, metallic compounds, semiconductors, and semiconductor compounds, for example.

Figure 3:
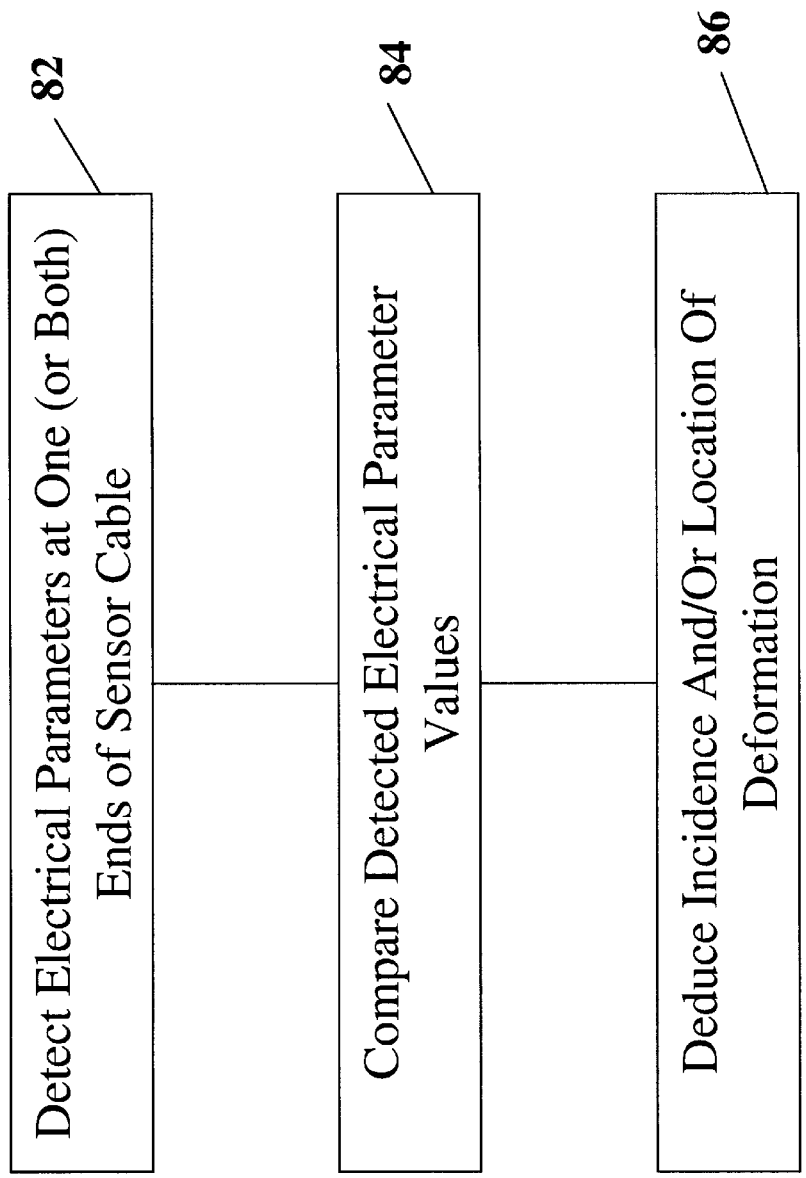
FIG. 3 is a flow diagram of exemplary process for detecting and/or locating a deformation of a sensor cable.

FIG. 3 is a flow diagram of exemplary process for detecting and/or locating a deformation of a sensor cable. Deformation of the cable creates a change in resistance between the shield 70 and the controlled resistive layer 50, and also creates a piezoelectric-induced voltage between the conductive core 20 and the controlled resistive layer 50. The occurrence and/or location of a deformation of the cable sensor 10 is accomplished by detecting electrical parameters, which are indicative of the change in resistance and induced voltage, at one or both ends of the cable sensor, at step 82. Electrical parameters include voltage, resistance, and current, for example. As described herein, electrical parameters existing on the controlled resistive layer 50, the core 20, and the shield 70 are measured. The values of these parameters detected at both ends of the sensor cable are compared at step 84. From the results of the comparison, the occurrence and location of a deformation of the cable are deduced at step 86. Comparison and deduction techniques are described below, with reference to FIGS. 4 and 5.

Figure 4:
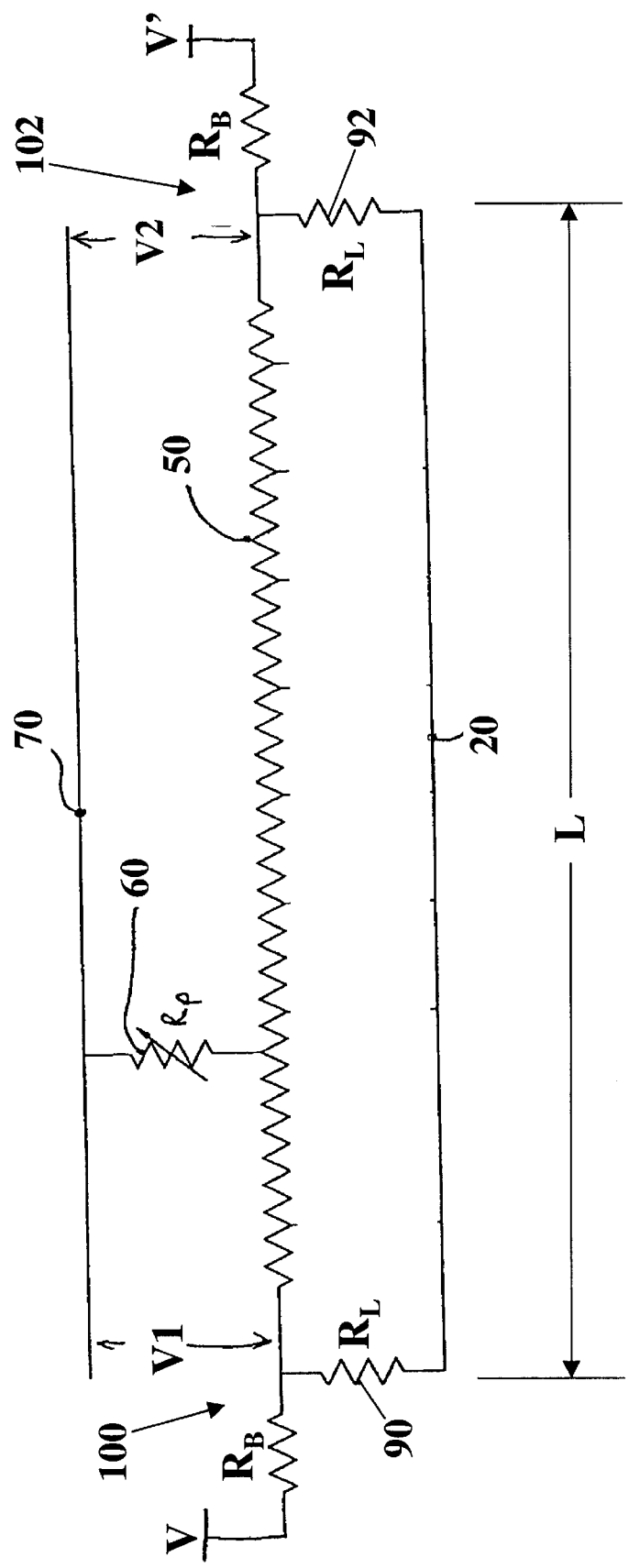
FIG. 4 is a schematic diagram of an equivalent circuit representation of a cable sensor for detecting and localizing an anomaly utilizing the piezoresistive portions of the cable sensor, in accordance with the present invention.

FIG. 4 is a schematic diagram of an equivalent circuit representation 125 of a cable sensor 10 for detecting and localizing an anomaly utilizing the piezoresistive portions of cable sensor 10. As shown in circuit 125, load resistors 90 and 92 are provided at respective ends 100, 102, of the cable sensor 10. Resistors RB are current limiting resistors, the values of which may be determined by design. For the purposes of the following discussion, the configuration of cable sensor 10 shown in FIG. 1 is used (i.e., without center conductor 25). Thus, each end 100, 102 of the cable sensor 10 is accessed directly. However, it is understood that the configuration of cable sensor 10 as shown in FIG. 2 (i.e., having center conductor 25) is also applicable to the following discussion. In the configuration of cable sensor 10 comprising center conductor 25, parameters may be sensed directly from both ends 100 and 102, or only from one end, 100 or 102, utilizing center conductor 25 to provide the signal to the end of the cable sensor at which parameters are being sensed.

As shown in FIG. 4, the resistive coating 50 is used in the manner of a potentiometer, with the region of compressed piezoresistive material 60 acting as the "center tap". The compressed piezoresistive material 60 forms a resistive link, $R_P$, between the highly conductive outer shield 70, and a given region of the resistive coating 50. The value of the resistive link, $R_P$, is responsive to the force applied to the piezoresistive layer 60. By comparison of the resistance between the shield 70 and the resistive coating 50, as measured at each end 100, 102 of the sensor cable, the presence and location of any compressive force along the length, L, of the sensor cable may be determined. A distributed capacitance 99 (see FIG. 5) resulting from dielectric layer 40 exists between the controlled resistive layer 50 and core 20. For purposes of determining and locating anomalies and/or deformations in accordance with this piezoresistive method, the distributed capacitance 99 may be neglected, and thus is not shown in FIG. 4.

Comparison between $R_P$ and the resistive coating 50 may be accomplished by applying fixed voltages V and V', at respective ends 100 and 102, between the shield and the exposed end of the resistive coating and measuring the resulting current through the resistive coating 50. Alternatively, the comparison may be accomplished by applying a fixed current through the resistive coating 50 and detecting voltage changes at points V1 and V2 of circuit 125. Preferably, V is approximately equal to V'. The comparison may also comprise a ratio of the two voltages or currents, and/or their sum, and/or their difference, for example. Furthermore, a cable sensor 10 operates to detect transient events such as impacts, as well as the presence of a permanent compressive deformation of the cable.

Figure 5:
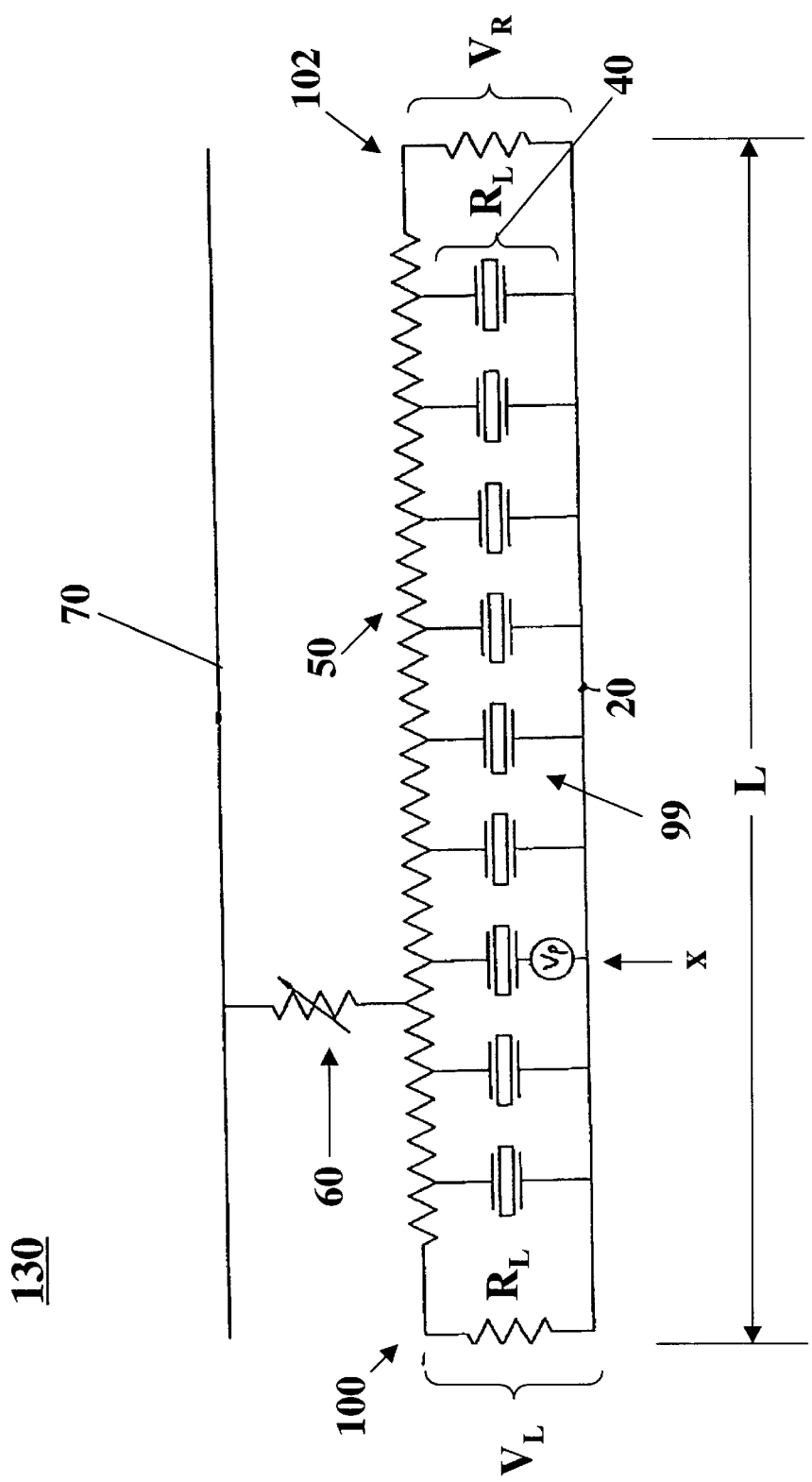
FIG. 5 is a schematic diagram of an equivalent circuit representation of a cable sensor for detecting and localizing an anomaly utilizing the piezoresistive and piezoelectric portions of the cable sensor, in accordance with the present invention.

FIG. 5 is a schematic diagram of an equivalent circuit representation 130 of a cable sensor for detecting and localizing an anomaly utilizing the piezoresistive and piezoelectric portions of cable sensor. Using a cable sensor formed of a piezoelectric material, the above procedure may be carried out simultaneously with the following detection principle, or may be performed periodically or intermittently.

In accordance with the piezoelectric properties of dielectric layer 40 (e.g., either by use of a polarized piezoelectric polymer such as PVDF or copolymers of VF2, or by use of permanently polarized electret material such as PTFE), then an induced charge or voltage created by an impact), at a given point (point x, for example) along the length L of the cable, a potential difference, $V_P$, is created between the wire core 20 and the resistive coating 50. The dielectric layer 40 is represented as a distributed capacitance 99 between the controlled resistive layer 50 and core 20. The voltage, $V_P$, is developed across this capacitance. The observed potential difference at each end of the cable $V_L$, $V_R$, varies according to the location of the impact.

Because the distributed resistance of the resistive coating and capacitance of the dielectric layer form a transmission line, not only does the peak amplitude of the resultant voltages at each end vary according to impact location, but also their relative phase and time to reach a fixed voltage threshold will vary with impact location. Higher frequencies are more rapidly attenuated than low frequencies as they propagate along the length of the cable, and so the observed waveforms may show different spectral components.

In this manner, the ratio, and/or sum, and/or difference, and/or phase, and/or threshold crossing time may be compared to determine the relative location of the event. It is contemplated that appropriate electrical circuitry is coupled to the terminals of the sensor cable for detecting and determining such data.

To calculate parameters in accordance with this piezoelectric method, let the total end-to-end resistance of the controlled resistive coating 50 be equal to $R_C$ ohms. In order to observe an output at each end of the cable 100 and 102, a load resistance $R_L$, is connected across each end 100 and 102 between resistive coating 50 and wire core 20. The variable "x" denotes the location of impact along the length of the sensor cable 10, where x varies from 0 at the left-hand extreme (100) to 1 at the right-hand extreme (102).

An impact at point "x" creates a piezoelectric voltage $V_P$ at point "x". The resulting voltages, $V_L$, observed at the left-hand end 100 of the cable sensor, and $V_R$, observed at the right hand side of cable sensor, are calculated in accordance with equations (1) and (2), respectively.

$$V_L = V_P\left(\frac{R_L}{R_L + x(R_C)}\right) \quad (1)$$

$$V_R = V_P\left(\frac{R_L}{R_L + (1-x)R_C}\right) \quad (2)$$

If the selected value of $R_L$ is much greater than $R_C$, the voltage observed at either end 100, 102 of the sensor cable changes only slightly with respect to location. Conversely, if the value of $R_L$ is chosen to be much less the $R_C$, a large change is seen as x (location) varies, but the actual value of signal "at the far end" will become extremely small.

In practice, a good compromise is found when the value of $R_L$ (the load resistance at each end) is numerically similar or identical to $R_C$, the end-to-end resistance of the controlled resistance coating 50.

When $R_L=R_C$, the following relationship results. The sum of $V_L$ and $V_R$ varies (as a quadratic) from 1.5 $V_P$ at the left extreme (100), reducing to a minimum of 1.333 $V_P$ at the midpoint of the sensor cable (i.e., L/2), and rises to 1.5 $V_P$ again at the right extreme (102). The difference, $V_L-V_R$, varies (as a quadratic) from 0.5 $V_P$ at the left extreme (100), passes through zero at the midpoint of the sensor cable (L/2), and reaches −0.5 $V_P$ at the right extreme (102). The ratio of the difference ($V_L-V_R$) to the sum ($V_L+V_R$) varies linearly from +0.333 to −0.333 as x varies from 0 to 1.

Furthermore, it has been found that the above relationships are valid when the load applied to the sensor cable is not concentrated on a single point, but is spread over a finite length. The ratio calculation indicates the mean location of the impact. Thus, if two impacts occur simultaneously at points equidistant from the midpoint of the sensor cable, the ratio will indicate the midpoint as being the location of impact. Furthermore, implementing different values of $R_L$ or $R_C$ affect the scaling of the above results, but the linear relationship between the ratio of the difference to sum (D/S), and location "x" is still valid. The D/S ratio is substantially independent of the magnitude of the applied load (assuming good linearity of the piezoelectric effect in the cable).

The frequency response of the sensor cable is dependent upon the values of $R_L$ and $R_C$. For example, values of $R_L$ and $R_C$ on the order of 20,000 to 50,000 ohms, (in conjunction with cable capacitance in the region of 1 to 2 nF) forms a high-pass filter. Impact signals with frequency content extending below the cut-off frequency of this filter will be differentiated with respect to time. The sum, difference, and ratio calculations described above are still valid. The signals may be integrated to restore the original force or impact waveform if desired, although this is not necessary. This differentiation in time signal, if present, will also reduce the absolute value of the voltages detected at each end.

The upper end of frequency response is also affected by the values of $R_C$, $R_L$, and the capacitance 99 of the cable. As the reactance of the cable capacitance approaches the value of $R_C$, the relationships shown above tend to become more complex, requiring the phase and amplitude of the signals arriving at each end to be compared. It should be noted, however, that with practical values of $R_C$ and cable capacitance, the propagation delay from one end of the sensor cable to the other is likely to be on the order of 1 microsecond per meter, and thus may not be useful in computing the location of an impact by this means alone. This delay will cause insignificant error in the amplitude sum and difference ratio calculation at frequencies of a few kilohertz and below.

The following represents exemplary values from a practical construction of the cable sensor 10 in accordance with the present invention for a 1-m length of cable 10. The cable includes a 20 awg stranded silver-plated copper core wire, poled piezoelectric copolymer (PVDF-TrFE) extruded to 1.6 mm OD, having 20 pC/N sensitivity, a capacitance of about 920 picofarads (pF) at 1 kHz. A sputtered nickel resistive coating having a total resistance measured end to end of 22,000 ohms is used. The termination resistors are fitted to each end (between core wire and resistive coating) in conventional fashion and have resistance of about 22,000 ohms. The ratio of near to far end measured voltages for impacts at various points along length L of cable 10 varies from 2:1 to 1:2.

The invention as described above may be applicable to various types of impact detection sensor system applications and configurations. An example of which is an impact detection and location cable sensor system wherein the core conductor is offset from the center of the cable. Another example is an impact detection and location sensor system configured as a flat cable, or ribbon cable. Although the present invention is described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A sensor cable having a first end and a second end, said cable comprising:
    an outer shield, a piezoresistive portion positioned within said outer shield, a controlled resistive portion positioned within said piezoresistive portion, a dielectric portion positioned within said controlled resistive portion, and a conductive core positioned within said dielectric portion.

2. A sensor cable in accordance with claim 1, wherein said cable is one of flat cable and a cylindrical cable.

3. A sensor cable in accordance with claim 2 wherein said cable is a cylindrical cable comprising:
    a conductive core positioned within said cable, a dielectric layer concentrically positioned radially outward and adjacent said conductive core, a controlled resistive layer concentrically positioned radially outward and adjacent said dielectric layer, a piezoresistive layer concentrically positioned radially outward and adjacent said resistive layer, and an outer shield concentrically positioned radially outward and adjacent said piezoresistive layer.

4. A sensor cable in accordance with claim 1, further comprising an outer jacket, wherein said outer shield is positioned within said outer jacket.

5. A sensor cable in accordance with claim 1, wherein
    a deformation of said cable creates a change in resistance between said shield and said controlled resistive portion;
    electrical parameters between said controlled resistive portion and said shield are detectable at each end of said cable; and
    a location of said deformation is deducible by comparing detected electrical parameters indicative of said change in resistance at each corresponding end of said cable.

6. A sensor cable in accordance with claim 5, wherein said electrical parameters comprise at least one of resistance, voltage, and current.

7. A sensor cable in accordance with claim 1, wherein said dielectric portion has piezoelectric properties.

8. A sensor cable in accordance with claim 7, wherein:
    a deformation of said cable creates a piezoelectrically-induced voltage between said conductive core and said controlled resistive portion;
    corresponding voltage values are detectable at each end of said cable between said core wire and said controlled resistive portion; and
    a location of said deformation is deducible by comparing detected voltage values at each corresponding end of said cable.

9. A sensor cable in accordance with claim 1, further comprising an insulated center conductor positioned within said conductive core.

10. A sensor cable in accordance with claim 9, wherein, electrical connections between said center conductor and said controlled resistive portion at said first end of said cable provide a means for at least one of detecting and locating a deformation of said cable from said second end of said cable.

11. A method for making a sensor cable, said method comprising the steps of:
    providing an outer shield;
    positioning a piezoresistive portion within said outer shield;
    positioning a controlled resistive portion within said piezoresistive portion;
    positioning a dielectric portion within said controlled resistive portion; and
    positioning a conductive core within said dielectric portion.

12. A method in accordance with claim 11, further comprising the step of positioning an insulated center conductor within said conductive core.

13. A method in accordance with claim 11, further comprising the step of positioning an outer jacket around said outer shield.

14. A method for detecting the presence of a deformation of a sensor cable comprising a first end, a second end, a conductive core, a dielectric layer, a controlled resistive layer, a piezoresistive layer, and an outer shield, said method comprising the steps of:

detecting electrical parameters indicative of a change in resistance between said shield and said controlled resistive layer at each end of said cable corresponding to said deformation; and comparing said detected electrical parameters at each corresponding end of said cable to detect a presence of said deformation.

15. A method in accordance with claim 14, further comprising the step of locating said deformation by comparing said detected electrical parameters at each corresponding end of said cable.

16. A method in accordance with claim 14, wherein said electrical parameters comprise at least one of resistance, voltage, and current.

17. A method in accordance with claim 14, wherein a deformation of said cable creates a piezoelectrically-induced voltage between said conductive core and said controlled resistive layer, said method further comprising the step of:

locating said deformation by comparing detected voltage values indicative of said piezoelectrically-induced voltage at each corresponding end of said cable.

18. A method in accordance with claim 14, wherein said conductive core further comprises an insulated center conductor positioned within said conductive core and said center conductor is electrically coupled to said controlled resistive layer at said first end of said cable, said method comprising the step of:

detecting said electrical parameters indicative of a change in resistance between said shield and said controlled resistive layer at said second end of said cable.

* * * * *